(12) United States Patent
Fink

(10) Patent No.: US 7,296,534 B2
(45) Date of Patent: Nov. 20, 2007

(54) HYBRID BALL-LOCK ATTACHMENT APPARATUS

(75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 10/808,388

(22) Filed: Mar. 25, 2004

(65) Prior Publication Data

US 2004/0250766 A1 Dec. 16, 2004

Related U.S. Application Data

(60) Provisional application No. 60/466,416, filed on Apr. 30, 2003.

(51) Int. Cl.
| | |
|---|---|
| C23C 16/50 | (2006.01) |
| C23F 1/00 | (2006.01) |
| H01L 21/306 | (2006.01) |
| C23C 16/503 | (2006.01) |
| C23C 16/505 | (2006.01) |
| C23C 16/509 | (2006.01) |

(52) U.S. Cl. .............. 118/723 E; 156/345.43; 156/345.45; 156/345.47

(58) Field of Classification Search ......... 118/715, 118/728, 723 E, 723 ER; 156/345.43–47, 156/345.45, 345.47; 279/9.1
See application file for complete search history.

(56) References Cited

U.S. PATENT DOCUMENTS

| | | | | | |
|---|---|---|---|---|---|
| 3,684,303 | A | * | 8/1972 | Serra ........................ | 279/82 |
| 4,522,697 | A | * | 6/1985 | Dimock et al. ........ | 204/192.12 |
| 4,523,985 | A | * | 6/1985 | Dimock .................. | 204/298.25 |
| 4,577,875 | A | * | 3/1986 | Miyakawa ................ | 279/75 |
| 4,612,077 | A | * | 9/1986 | Tracy et al. ............ | 156/345.34 |
| 4,900,202 | A | * | 2/1990 | Wienhold ................. | 408/240 |
| 5,013,194 | A | * | 5/1991 | Wienhold ................. | 408/240 |
| 5,110,437 | A | * | 5/1992 | Yamada et al. ......... | 204/298.33 |
| 5,262,029 | A | * | 11/1993 | Erskine et al. ......... | 204/298.15 |
| 5,332,443 | A | * | 7/1994 | Chew et al. ............ | 118/729 |
| 5,354,413 | A | * | 10/1994 | Smesny et al. ........ | 156/345.47 |
| 5,423,936 | A | * | 6/1995 | Tomita et al. ........ | 156/345.34 |
| 5,433,784 | A | * | 7/1995 | Miyagi et al. ........... | 118/715 |
| 5,464,229 | A | * | 11/1995 | Salpaka .................... | 279/30 |
| 5,534,751 | A | * | 7/1996 | Lenz et al. ............. | 315/111.71 |
| 5,628,829 | A | * | 5/1997 | Foster et al. ............ | 118/723 E |
| 5,746,875 | A | * | 5/1998 | Maydan et al. ........ | 156/345.34 |
| 5,845,898 | A | * | 12/1998 | Halder et al. ............ | 269/48.1 |
| 6,019,060 | A | * | 2/2000 | Lenz ......................... | 118/723 R |
| 6,086,710 | A | * | 7/2000 | Miyashita et al. ..... | 156/345.34 |
| 6,123,775 | A | * | 9/2000 | Hao et al. ................. | 118/724 |
| 6,178,919 | B1 | * | 1/2001 | Li et al. ................... | 118/723 E |
| 6,412,437 | B1 | * | 7/2002 | Campbell et al. ........ | 118/723 E |

(Continued)

FOREIGN PATENT DOCUMENTS

SU 906648 B * 2/1982

Primary Examiner—Rudy Zervigon
(74) Attorney, Agent, or Firm—Oblon, Spivak, McClelland, Maier & Neustadt, P.C.

(57) ABSTRACT

The present invention uses hybrid ball-lock devices as an alternate for threaded fasteners. Parts of the fastener exposed directly to the plasma act as a shield for the remaining pieces of the fastener or are used as a material to actually enhance plasma characteristics. The present invention also provides consistent electrical and mechanical contact between parts, without the use of any tools.

20 Claims, 13 Drawing Sheets

U.S. PATENT DOCUMENTS

| | | | |
|---|---|---|---|
| 6,492,774 B1 * | 12/2002 | Han et al. | 315/111.21 |
| 6,561,523 B1 * | 5/2003 | Wienhold | 279/30 |
| 6,669,811 B2 * | 12/2003 | Hao et al. | 156/345.3 |
| 6,686,302 B1 * | 2/2004 | Moser | 442/286 |
| 6,806,653 B2 * | 10/2004 | Strang et al. | 315/111.71 |
| 6,818,096 B2 * | 11/2004 | Barnes et al. | 156/345.43 |
| 6,863,784 B2 * | 3/2005 | Hao et al. | 204/192.1 |
| 6,910,441 B2 * | 6/2005 | Jang | 118/723 R |
| 6,926,803 B2 * | 8/2005 | Antolik | 118/500 |
| 6,936,135 B2 * | 8/2005 | Antolik | 118/500 |
| 6,962,664 B2 * | 11/2005 | Mitrovic | 216/59 |
| 6,966,562 B1 * | 11/2005 | Wienhold | 279/75 |
| 2002/0108711 A1 * | 8/2002 | Kim | 156/345.33 |
| 2002/0124801 A1 * | 9/2002 | Hanson | 118/728 |
| 2002/0150519 A1 * | 10/2002 | Barnes et al. | 422/186.04 |
| 2003/0029567 A1 * | 2/2003 | Dhindsa et al. | 156/345.47 |
| 2004/0020429 A1 * | 2/2004 | Jang | 118/715 |
| 2005/0011446 A1 * | 1/2005 | Fink | 118/715 |

* cited by examiner

HYBRID BALL-LOCK ATTACHMENT APPARATUS

CROSS REFERENCE TO RELATED APPLICATIONS

This application claims priority to and is related to U.S. Provisional Application Ser. No. 60/466,416, filed on Apr. 30, 2003. The content of this application is incorporated herein by reference.

BACKGROUND OF THE INVENTION

Field of the Invention

This invention relates to an improved component for a plasma processing system, and more particularly, to hardware fasteners for internal chamber parts in a plasma processing chamber such as fasteners using actuating type or spring plunger type hybrid ball-lock devices.

The fabrication of integrated circuits in the semiconductor industry typically employs plasma to create and assist surface chemistry within a plasma reactor necessary to remove material from and deposit material to a substrate. In general, plasma is formed with the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gasses under predetermined conditions (e.g. chamber pressure, gas flow rate etc.) are chosen to produce a population of charged species and chemically reactive species suitable to the particular process being performed within the chamber, e.g. etching processes where materials are removed from the substrate or deposition where materials are added to the substrate.

Although the formation of a population of charged species (ions, etc.) and chemically reactive species is necessary for performing the function of the plasma processing system (i.e. material etch, material deposition, etc.) at the substrate surface, other component surfaces on the interior of the plasma processing chamber are exposed to the physically and chemically active plasma and, in time, can erode. The erosion of exposed components in the plasma processing system can lead to a gradual degradation of the plasma processing performance and ultimately to complete failure of the system.

A need exists for an attachment apparatus that minimizes the hardware necessary to assemble internal components of a plasma-processing chamber. Removal of parts secured with hardware, especially threaded hardware, is time consuming, requires hand or power tools and tends to create particles as the hardware is removed and subsequently replaced. Each piece of hardware adds another part that must be procured, inspected, cleaned, assembled and controlled.

When installing parts using threaded hardware, consistent assembly is difficult to accomplish. To obtain consistent interface between parts, secured by threaded fasteners, the fasteners must be secured to specific torque requirements. This also requires additional tools. A need exists to consistently assemble internal plasma processing parts without special tools, processes and inspections.

Most current plasma tools utilize threaded hardware to secure internal chamber parts as necessary. Hardware is secured in place and may require specific torque specifications. Usually, extra parts are required to shield hardware after installation. The shield parts can cover multiple hardware devices or can be made to cover each piece of hardware individually.

Known plasma processing chambers employ a minimum number of threaded fasteners which can be shielded from the plasma utilizing associated shielding devices.

SUMMARY OF THE INVENTION

These and other problems are addressed by the present invention, which provides an apparatus and method for attaching replaceable parts within a process chamber such that the need to clean the chamber is reduced.

The present invention utilizes an actuating hybrid ball-lock device or a hybrid spring-plunger type ball-lock device to reduce the need for threaded fasteners.

BRIEF DESCRIPTION OF THE DRAWINGS

The above-noted and other aspects of the present invention will become more apparent from a detailed description of preferred embodiments when read in conjunction with the drawings, wherein.

DETAILED DESCRIPTION OF THE PREFERRED EMBODIMENTS

Figure 1:
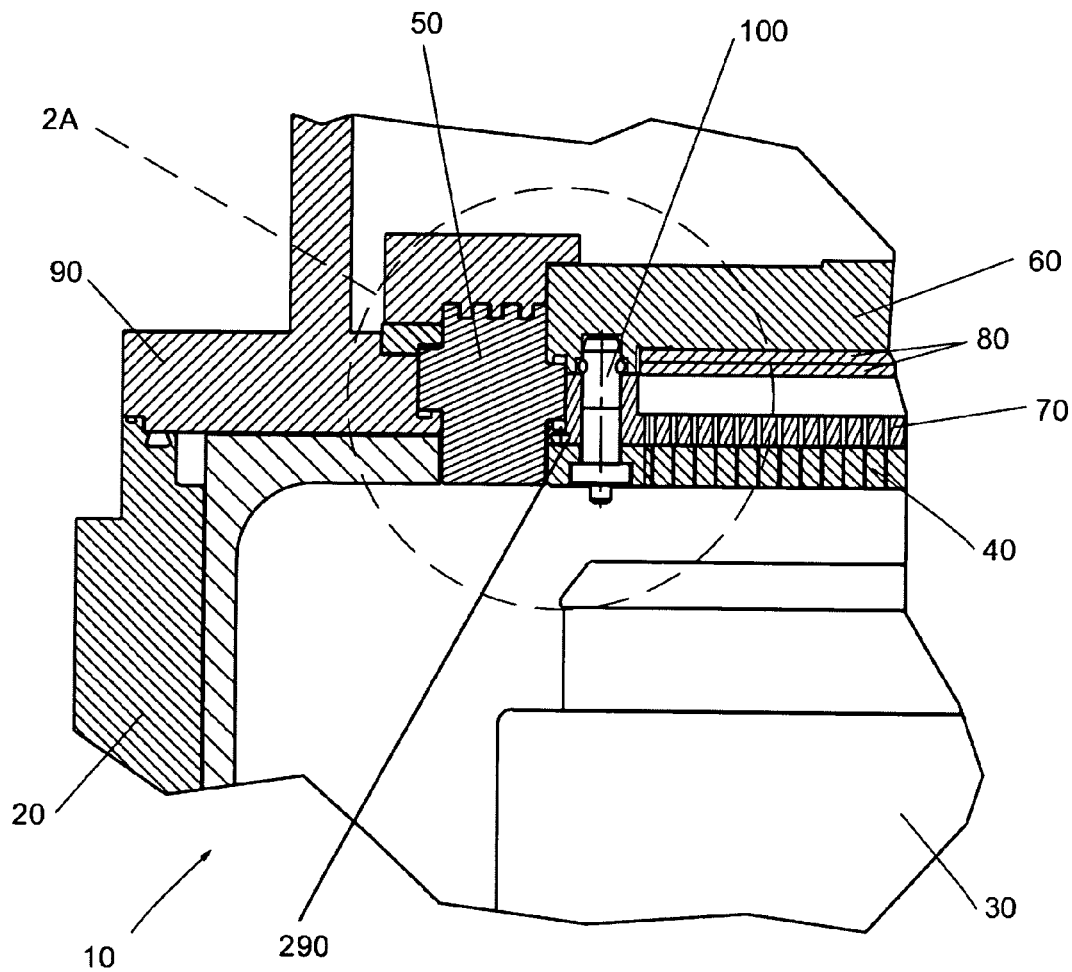
FIG. 1 represents a cut-away view of a plasma process chamber in which a hybrid ball-lock device is shown.

With reference to FIG. 1, a plasma-processing device 10 is shown. The plasma processing device 10 can include a process chamber 20, a chuck assembly 30, an inject plate 40, a ceramic insulator 50, and an upper electrode including an upper electrode portion 60, and a lower electrode portion 70. Baffle plates 80 can also be included in the construction of the plasma-processing device 10. The plasma-processing device 10 is typically configured such that an upper housing 90 is electrically insulated from the upper electrode portion 60 and the lower electrode portion 70 by the ceramic insulator 50.

The plasma-processing device 10 has a hybrid ball-lock device 100. In FIG. 1, the hybrid ball-lock device 100 is depicted as maintaining secure contact between the inject plate 40 and the assembly made up of the upper electrode portion 60, lower electrode portion 70, and baffle plates 80. Use of the hybrid ball-lock device 100 can allow the reduction in the number of threaded fasteners that must be used in the plasma-processing device 10. The hybrid ball lock-device 100 can be used to secure any of the other parts of the plasma-processing device 10 together, which negates the need for threaded fasteners. Additionally, a hybrid spring plunger or detent pin could have been used in place of a hybrid ball-lock device in this application As can more clearly be seen in FIG. 2A, a cutaway view of the hybrid ball-lock device 100 is represented. The hybrid ball-lock device is comprised of an actuating shaft 200, axial spring 210, release button 220, at least one retaining ball 230, head 240, and CRES fastener housing 250 and at least one retaining pin 275. The inject plate 40 has a first hole 41 with a first diameter 42. The lower electrode has a third hole 70 with a third diameter 71. The upper electrode 60 has a second hole 61. The second hole 61 has a recessed area 63 with a second diameter 62. The at least one retaining ball 230 moves into the recessed area 63. At a boundary of the recessed area 63, a seam 292 begins. The seam 292 is sealed by a compressible seal 291.

Figure 2A:
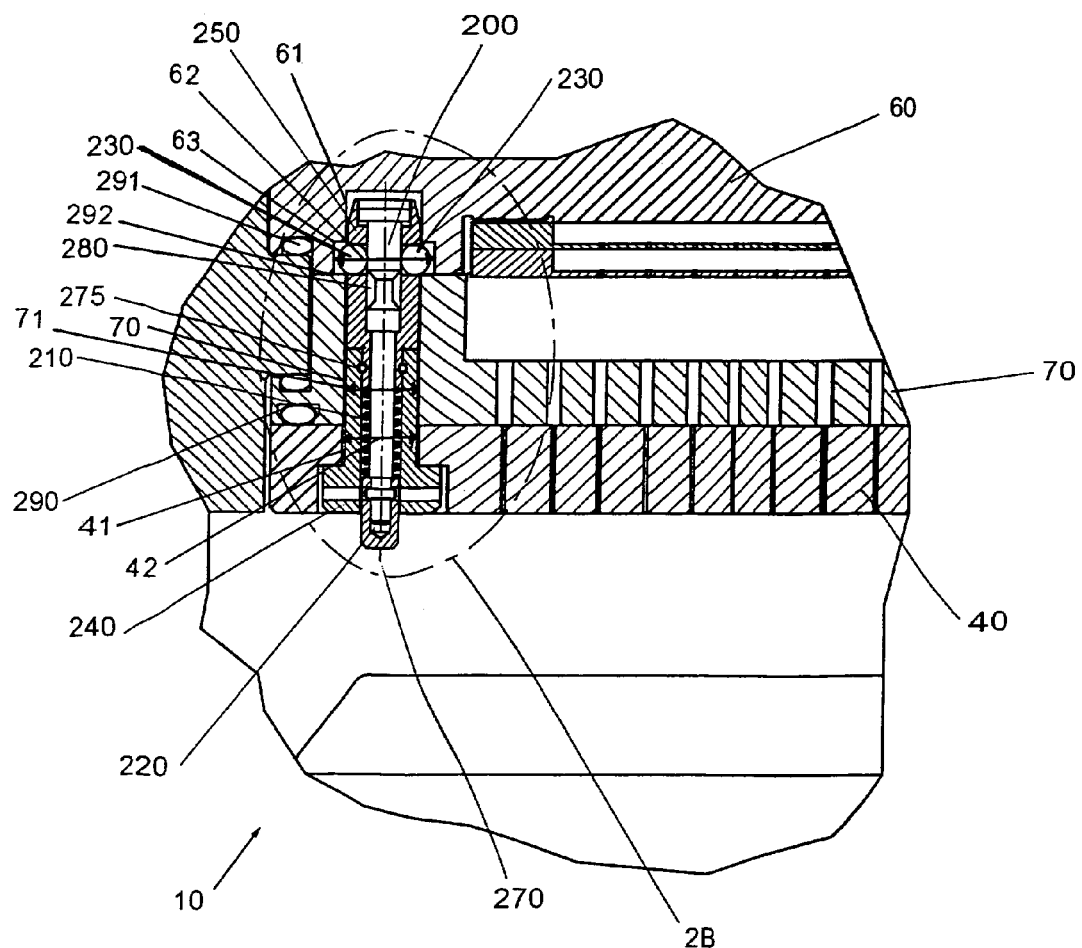
FIG. 2A represents a close-up cut-away view of a plasma process chamber in which the internal constitution of an actuating hybrid ball-lock device is shown in more detail.
Figure 2B:
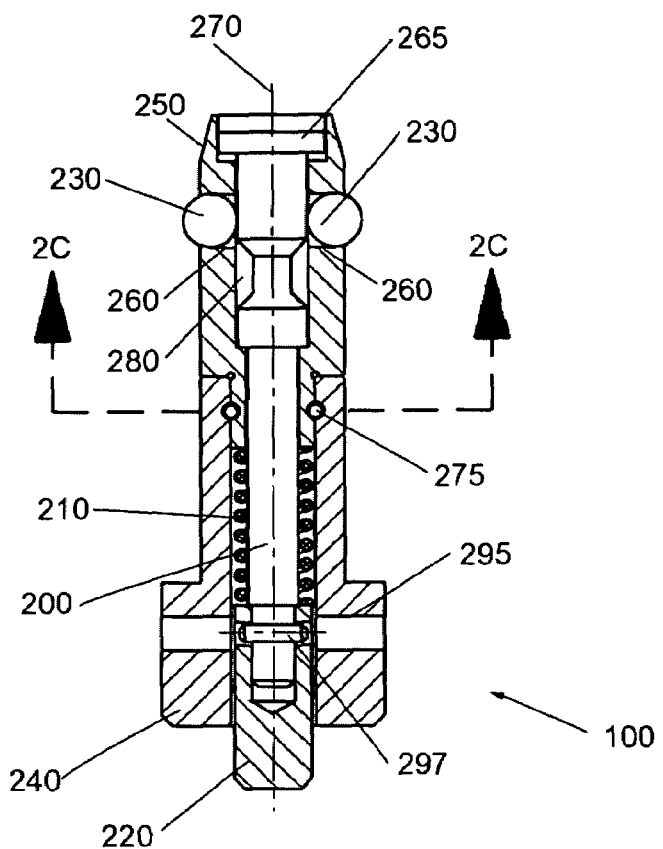
FIG. 2B depicts a close-up view of the construction of a hybrid ball-lock device.
Figure 2C:
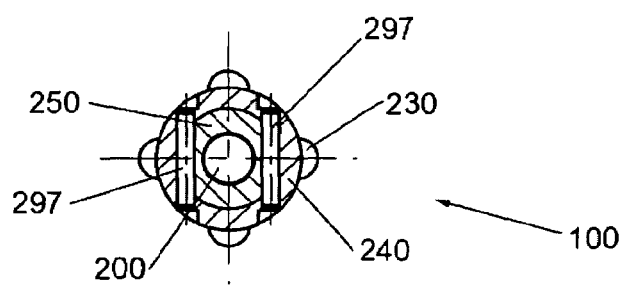
FIG. 2C depicts a sectional view of the embodiment of FIG. 2B showing location of assembly retaining pins.

As more clearly seen in FIG. 2B and FIG. 2C, the CRES fastener housing 250 is constructed such that one or more cross-drilled holes 260 are drilled perpendicular to an axis 270 of the CRES fastener housing 250. At assembly of the ball-lock device 100, each retaining ball 230 is inserted into the cross-drilled holes 260 such that they can freely move therethrough until reaching an area of smaller diameter near the outside surface of the CRES fastener housing 250 and are subsequently retained therein.

Each retaining pin 275 helps provide secured contact between head 240 and CRES fastener housing 250. In this embodiment at least one retaining pin 275 is installed using locational interference or thermal fits.

The actuating shaft 200 is retained in the ball-lock device 100 by an internal head feature 265 mating to a bore in the fastener housing 250, an axial spring 210 and the release button 220, as shown. The axial compression spring 210 provides a constant axial force against the release button 220; therefore, the release button must be secured to the actuating shaft 200.

The last operation completed as the ball-lock device is assembled, is mechanically pinning the release button 220 to the actuating shaft 200. This is accomplished mechanically with locational interference or thermal fits commonly known to a person having ordinary skill in the art, through a cross-drilled access hole 295 in head 240. Also, retaining pin 297, is shown to facilitate contact between the release button 220 and the actuating shaft 200.

Figure 2D:
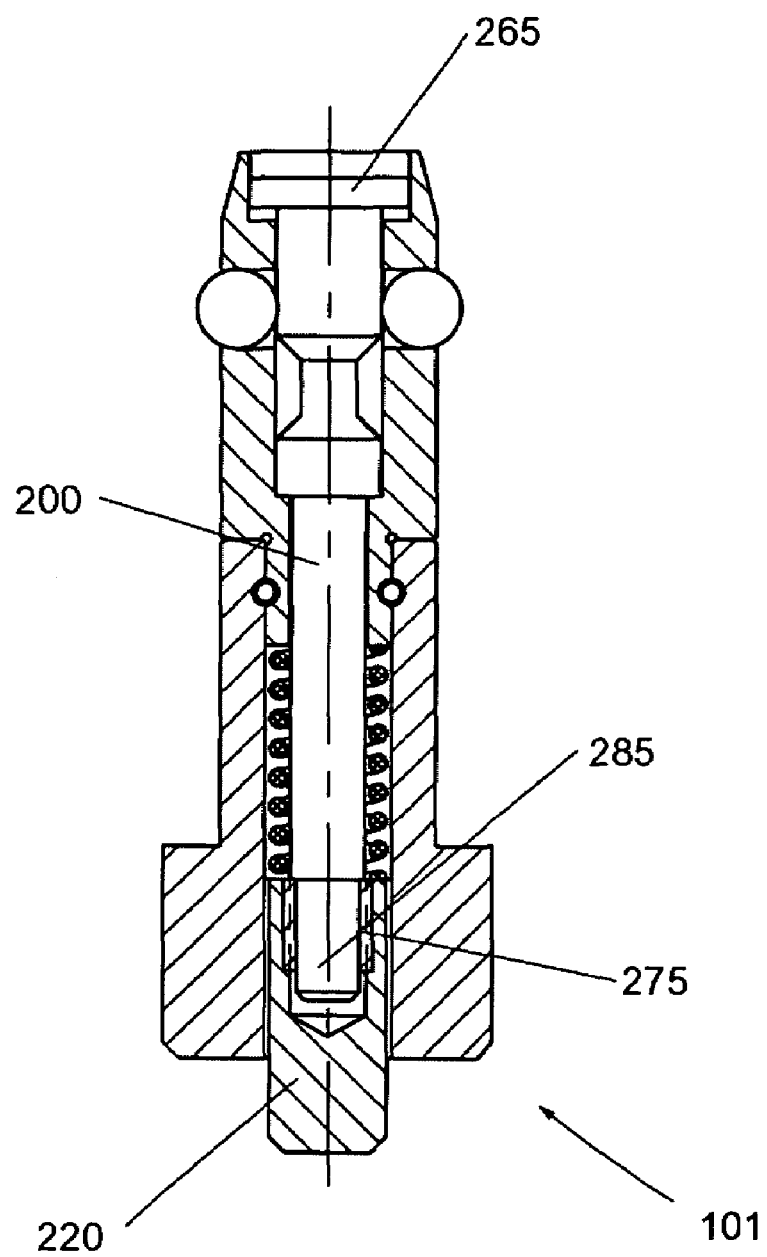
FIG. 2D depicts an alternate attachment of a release button to the hybrid ball-lock device.

As shown in FIG. 2D, alternately, a method of attaching the release button 220 to the actuating shaft 200 can be used in which pinning devices are not necessary. This method requires a locking or non-locking insert 275 to be installed in the release button 220 which mates to a threaded end 285 of actuating shaft 200. A slot in the head feature 265 of the actuating shaft 200 opposite the threaded end 285 would allow tightening of the two parts to particular torque requirements as necessary at the assembly of the hybrid ball-lock device 101.

As shown in FIG. 1 and FIG. 2B when the hybrid ball-lock device 100 is actuated, the actuating shaft 200 moves until relieved section 280 of the actuating shaft 200 becomes adjacent to retaining ball 230. As retaining ball 230 moves to the relieved section 280 of the actuating shaft 200, the hybrid ball-lock device 100 can then be removed from the plasma-processing device 10.

An electrical contact device 290 is shown in FIGS. 1 and 2A as well. The electrical contact device 290 ensures consistent electrical and mechanical contact between the inject plate 40 and the lower electrode 70 when the ball-lock assembly 100 is installed in the plasma-processing device. The electrical contact device 290 may or may not be used with various embodiments of the present invention.

By way of example, in this configuration, the release button 220 can be made of a ceramic material, quartz, silicon, silicon carbide, carbon, Vespel, Teflon, anodized aluminum, fine coated ceramic covering a metallic material or other materials suitable for plasma processing applications. Any number of shapes or lengths can be used for the release button 220.

As is known in the art, a getter material is added during the plasma process in small amounts to adsorb impurities, whereas a scavenging material can cause introduction of a specific material to the plasma process to affect process chemistry. For example, when silicon is used for the release button 220, the release button 220 can be partially consumed, hence, introducing silicon to the plasma process and, consequently, help to modify the plasma process. Therefore, the hybrid ball-lock device can make the plasma process even more efficient.

Figure 3A:
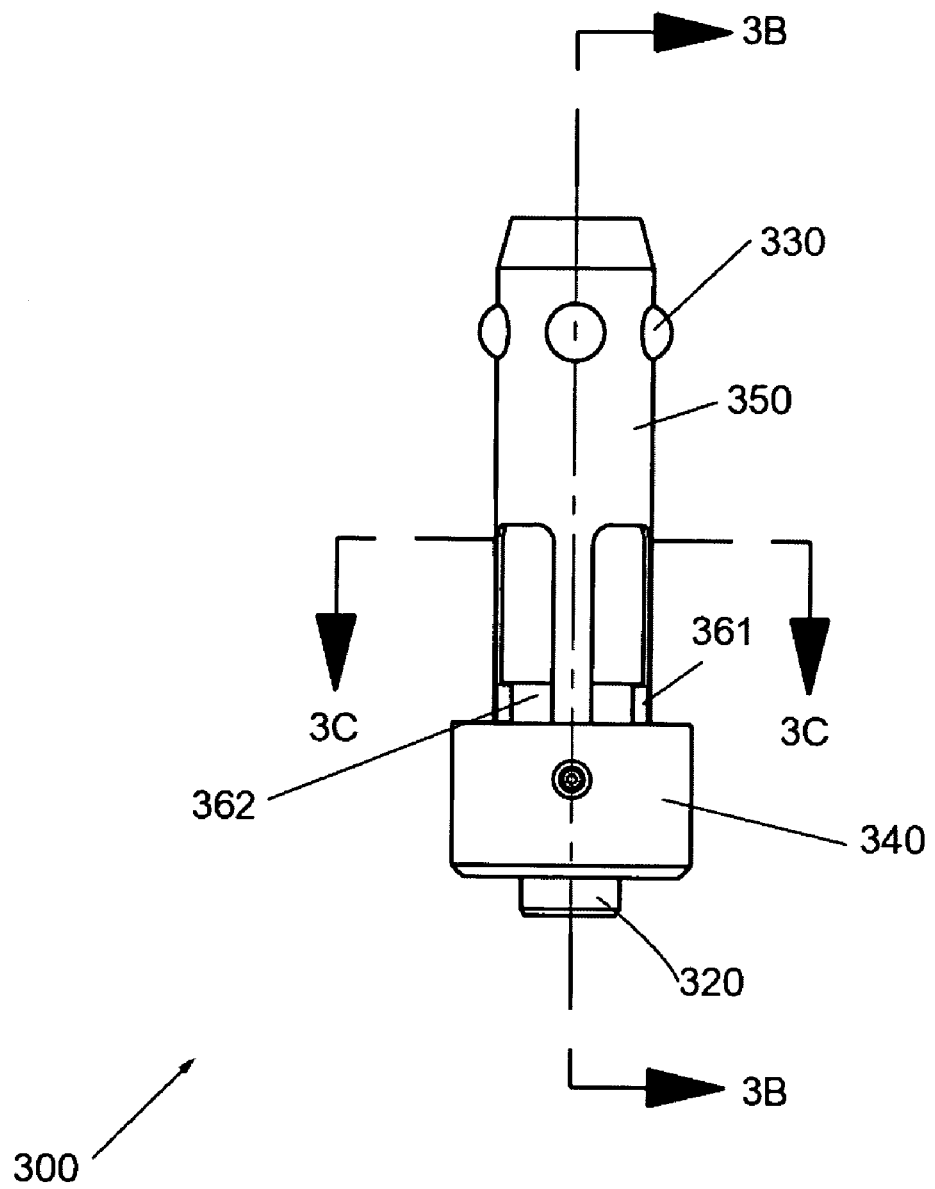
FIG. 3A represents a side view an embodiment of an actuating hybrid ball-lock device wherein the corrosion resistant steel (CRES) shaft is attached to the head with thin clamping fingers of CRES material.
Figure 3B:
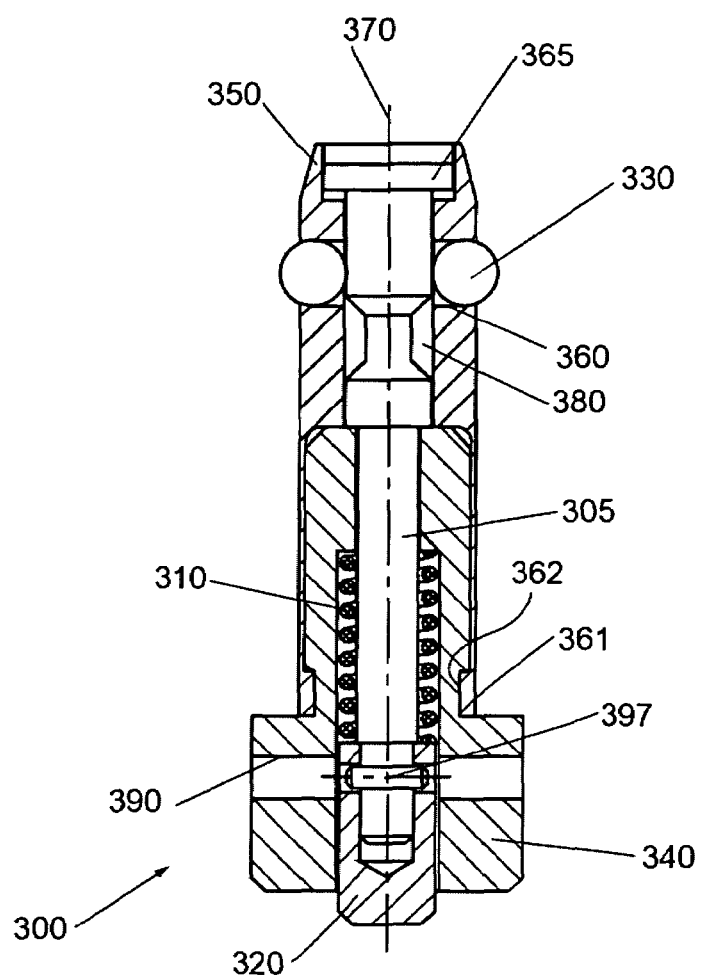
FIG. 3B represents a sectional view of the embodiment of FIG. 3A showing internal components.
Figure 3C:
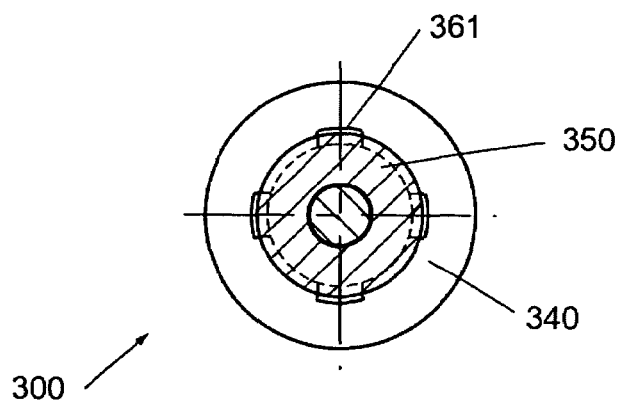
FIG. 3C represents a sectional view of the embodiment of FIG. 3A showing head, clamping fingers and CRES shaft.

FIG. 3A, FIG. 3B and FIG. 3C depict a further embodiment of the present invention in which a hybrid ball-lock device 300 is comprised of an actuating shaft 305, axial spring 310, release button 320, at least one retaining ball 330, head 340, and CRES fastener housing 350.

As more clearly seen in FIG. 3B, the CRES fastener housing 350 is constructed such that two or more cross-drilled holes 360 are drilled perpendicular to an axis 370 of the CRES fastener housing 350. At assembly of the hybrid ball-lock device 300, each retaining ball 330 is inserted into the cross-drilled holes 360 such that they can freely move therethrough until reaching an area of smaller diameter near the outside surface of the CRES fastener housing 350 and are subsequently retained therein. As shown in FIG. 3A, FIG. 3B and FIG. 3C, the fastener housing is constructed such that two or more thin retaining fingers 361 are fashioned to mate to a groove 362 in head 340. The fingers 361 secure the fastener housing 350 to the head 340 as the hybrid ball-lock device 300 is assembled together. The retaining fingers 361 are an alternate embodiment to the retaining pins 275 described in the first embodiment of the hybrid ball-lock device.

The actuating shaft 305 is retained in the ball-lock device 300 by an internal head feature 365 mating to a bore in the fastener housing 350, an axial spring 310 and the release button 320, as shown. The axial compression spring 310 provides a constant axial force against the release button 320; therefore, the release button must be secured to the actuating shaft 305. The last operation completed as the ball-lock device is assembled, is mechanically pinning the release button 320 to the actuating shaft 305. This is accomplished mechanically with locational interference or thermal fits commonly known to a person having ordinary skill in the art, through a cross-drilled access hole 390 in head 340. Also, as depicted in FIG. 3B, retaining pin 397, is shown to facilitate contact between the release button 320 and the actuating shaft 305.

As described above, an alternate method of attaching the release button 320 to the actuating shaft 305 can be accomplished with an insert located in the release button and a mating thread located on the actuating shaft.

As the hybrid ball-lock device 300 is actuated, the actuating shaft 305 moves until relieved section 380 of the actuating shaft 305 becomes adjacent to retaining ball 330. As retaining ball 330 moves to the relieved section 380 of the actuating shaft 305, the ball-lock device 300 can then be removed from the plasma-processing device 10.

Figure 4A:
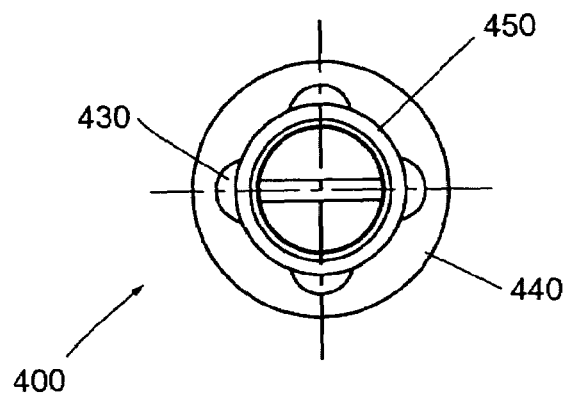
FIG. 4A represents a plan view of an embodiment of an actuating hybrid ball-lock device wherein a head is brazed to a CRES shaft.
Figure 4B:
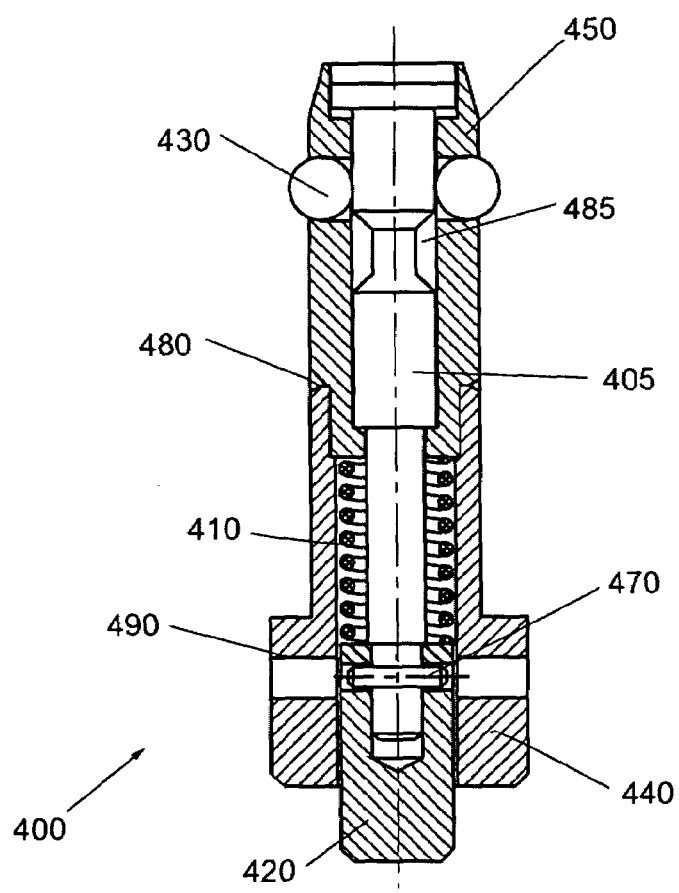
FIG. 4B represents a sectional view of the embodiment of FIG. 4A showing internal components.

FIG. 4A and FIG. 4B depict a further embodiment of the present invention in which an actuating shaft 405 is used in hybrid ball-lock device 400. This further embodiment is comprised of an actuating shaft 405, CRES fastener housing 450, head 440, at least one retaining ball 430, release button 420, axial compression spring 410, retaining pin 470, and kovar braze joint 480. The brazed joint 480 is an alternate embodiment to the retaining pin 275 described in the first embodiment of the hybrid ball-lock device.

The axial compression spring 410 provides a constant axial force against the release button 420; therefore, the release button must be secured to the actuating shaft 405. The last operation completed as the ball-lock device is assembled, is mechanically pinning the release button 450 to the actuating shaft 410. This is accomplished mechanically with locational interference or thermal fits commonly known to a person having ordinary skill in the art, through a cross-drilled access hole 490 in head 440. Also, retaining pin 470 is shown to facilitate contact between the release button 450 and the actuating shaft 405.

As described above an alternate method of attaching the release button 420 to the actuating shaft 405 can be accomplished with an insert located in the release button and a mating thread located on the actuating shaft.

Again as before, the hybrid ball-lock device 400 is actuated, the actuating shaft 405 moves until relieved section 485 of the actuating shaft 405 becomes adjacent to retaining ball 430. As retaining ball 430 moves to the relieved section 485 of the actuating shaft 405, the hybrid ball-lock device 400 can then be removed from the plasma-processing device 10.

Figure 5A:
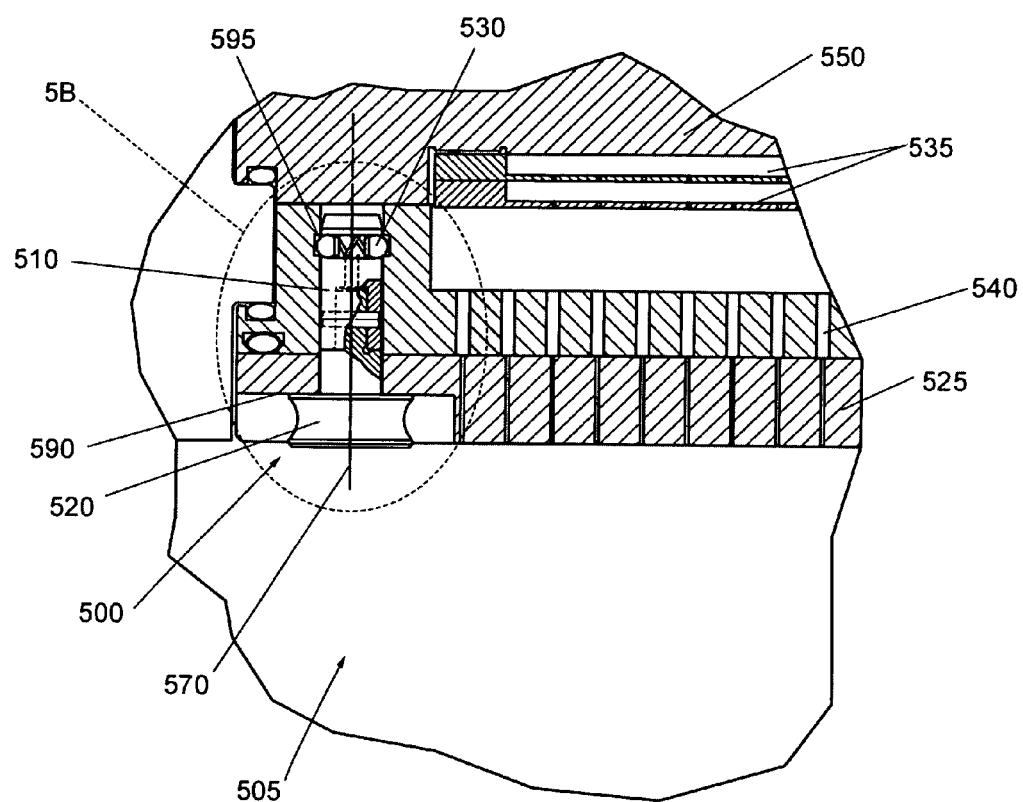
FIG. 5A represents a close-up cutaway view of a plasma process chamber in which the internal constitution of a hybrid spring plunger ball-lock device is shown in more detail.

FIG. 5A represents a cutaway view of a plasma process chamber 505 in which the internal constitution of a hybrid spring plunger ball-lock device 500 is more clearly depicted. The hybrid spring plunger ball-lock device 500 is inserted into a recess 590 in the inject plate 525 and the lower electrode portion 540. At least one sub-recess 595 is located in the recess 590. Each sub-recess 595 corresponds to each retaining ball 530. The recess 590 is shaped similarly to the CRES shank 510 and is intended to receive the CRES shank 510. The diameter of the recess 590 is large enough to accept the CRES shank 510. The sub-recess 595 extends away from the axis 570 of the hybrid spring plunger device 500. When the hybrid spring plunger ball-lock device 500 initially engages the recess 590, each retaining ball 530 is pushed toward the axis 570 of the hybrid spring plunger ball-lock device 500 by the recess 590. Once each retaining ball 530 reaches the sub-recess 595 each retaining ball 530 is pushed out away from the axis 570, to its normal position, thereby locking the hybrid spring plunger ball-lock device 500 in place. To remove the hybrid spring plunger ball-lock device 500 from recess 590, one need only grasp head 520 and pull with enough force to cause each retaining ball 530 to withdraw from sub-recess 595 toward axis 570.

Figure 5B:
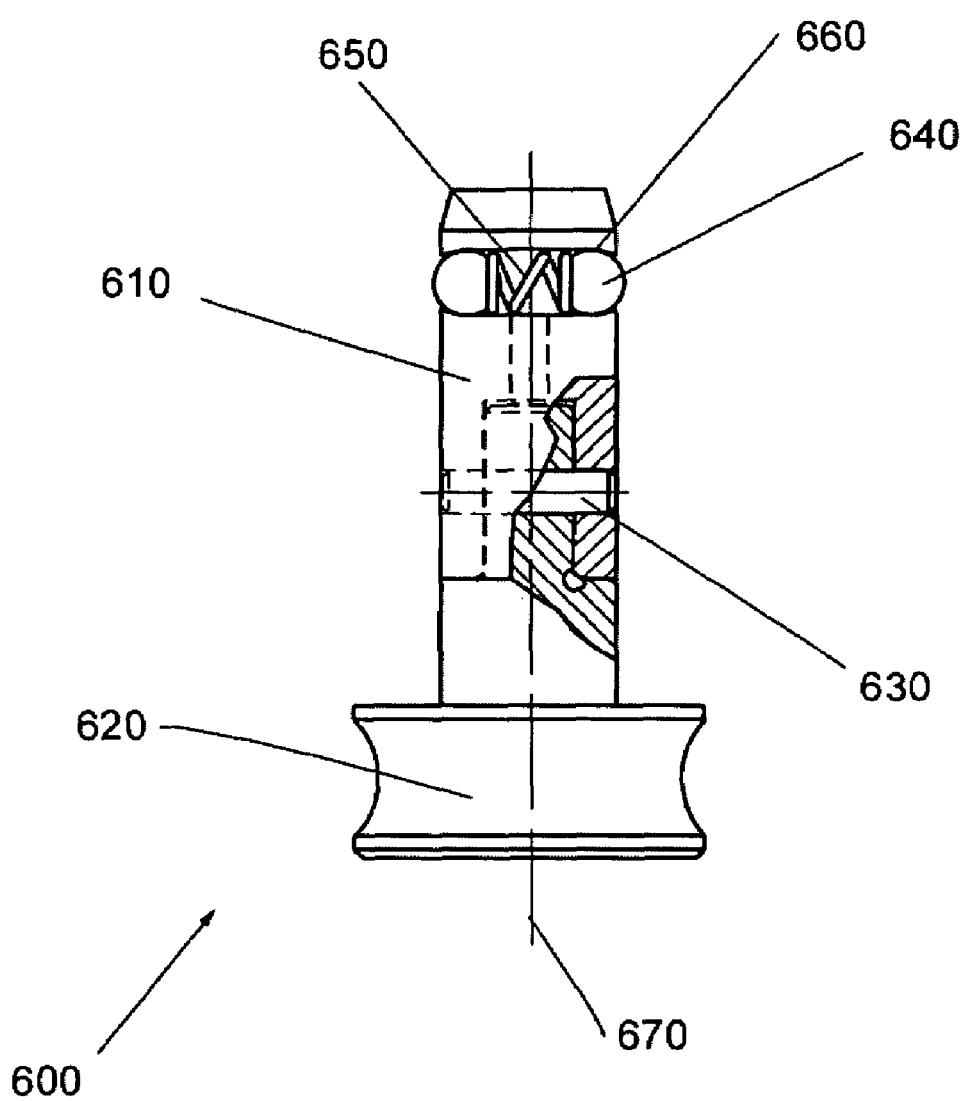
FIG. 5B represents a close up view of the embodiment of FIG. 5A in which the construction of a hybrid spring plunger ball-lock device is shown in more detail.

As can be more clearly seen in FIG. 5B, a hybrid spring plunger ball-lock device 600 is depicted in which a CRES shank 610 and a head 620 are mechanically pinned together with a retaining pin 630. Retaining pin 630 can be fabricated from CRES or aluminum. The head 620 can be ceramic, silicon, anodized aluminum, quartz, silicon carbide, carbon, Vespel, Teflon, or fine coated ceramic or metallic materials. At least one retaining ball 640 is located in the CRES shank 610. The retaining ball 640 is pushed toward the outer surface of the CRES shank 610 by a transverse spring 650.

The CRES shank 610 is substantially cylindrical and is constructed with a cross drilled hole 660 perpendicular to the axis 670 of the hybrid spring plunger ball-lock device 600. The cross-drilled hole 660 can have any diameter as long as the diameter near the outer surface of the CRES shank 610 is smaller than the diameter of each retaining ball 640. Each retaining ball 640 and transverse spring 650 are retained in the CRES shank 610 by the smaller diameter of the cross-drilled hole 660.

The cross-drilled hole 660 has a substantially uniform diameter during the manufacture of the CRES shank 610. After the manufacture of the CRES shank 610, the cross-drilled hole 660 is processed to have said smaller diameter near the outer surface of the CRES shank 610. The process of modifying the cross-drilled hole 660 after assembly of the transverse spring 650 and retaining ball 640 to the CRES shank 610 is accomplished with common metal cold working techniques.

Figure 5C:
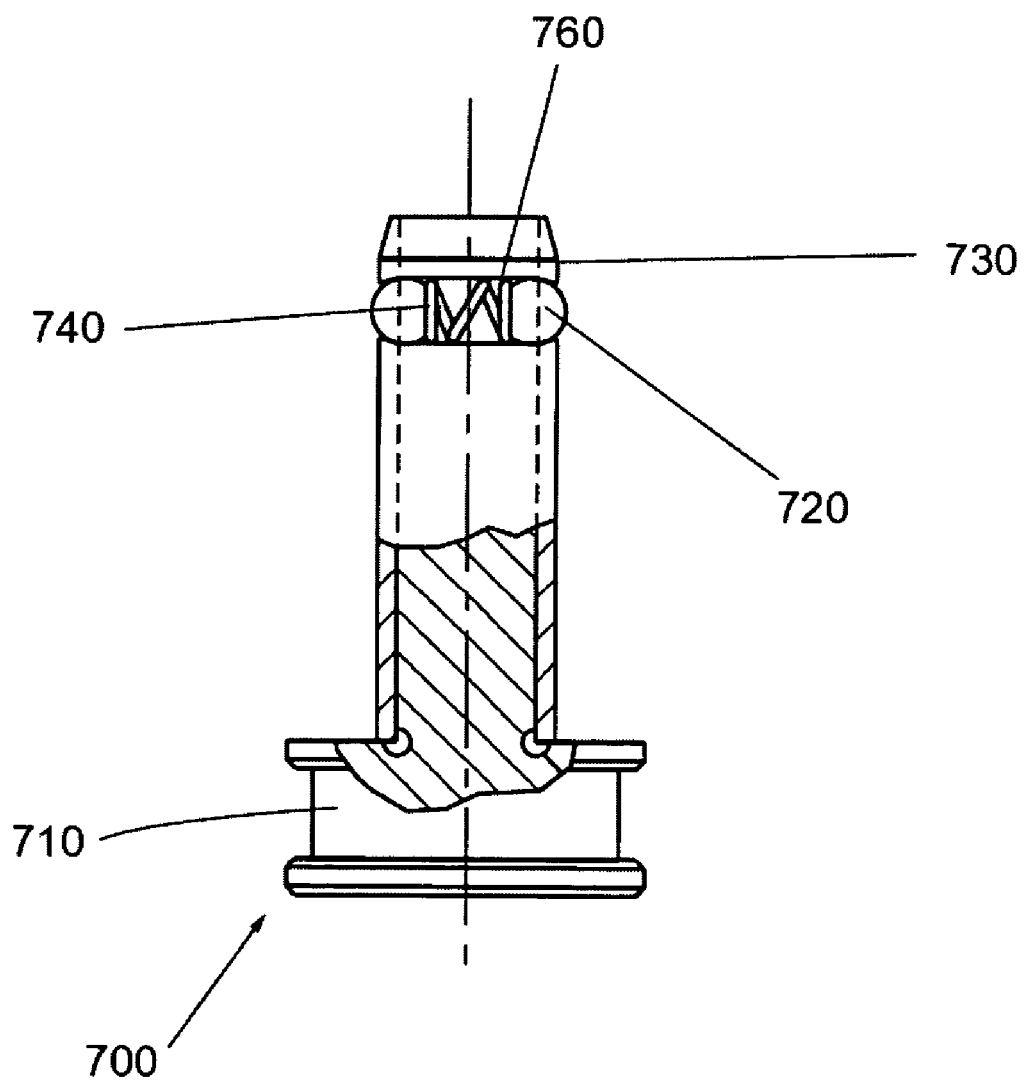
FIG. 5C represents an embodiment of a hybrid spring plunger ball-lock device wherein a head is thermally fit into a CRES sleeve.

As can be seen in FIG. 5C, a further embodiment of the present invention involves a hybrid spring plunger type ball-lock device 700. The hybrid spring plunger type ball-lock device is comprised of a head 710, at least one retaining ball 720, a CRES sleeve 730, and a transverse spring 740. As with the previous embodiments, the head 710 can be ceramic, silicon, quartz, or anodized aluminum. The head 710 can also be a ceramic or a metallic material covered in fine-coated ceramic material. The CRES sleeve 730 is thermally fit to the head 710 in this embodiment and captivates each retaining ball 720 and transverse spring 740 in place in cross-drilled hole 760.

Figure 5D:
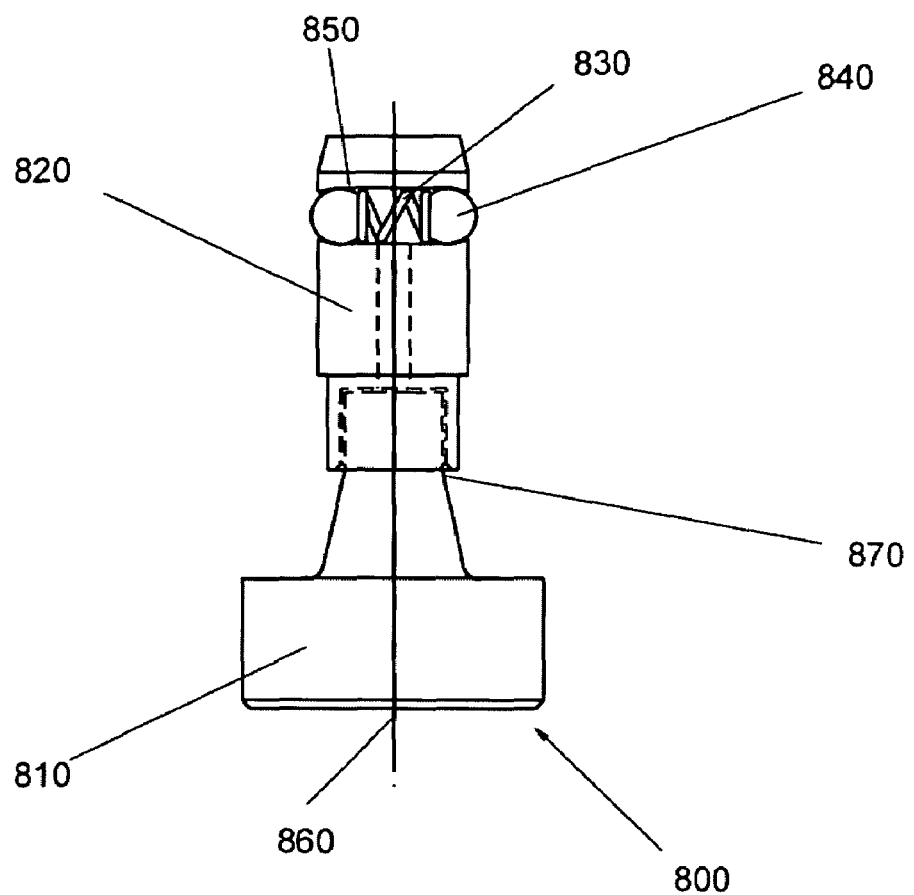
FIG. 5D represents an embodiment of a hybrid spring plunger ball-lock device wherein a head is brazed to a CRES shank.

A further embodiment of the present invention employs the use of a hybrid spring plunger ball-lock device 800 and is depicted in FIG. 5D. The hybrid spring plunger ball-lock device 800 is comprised of a head 810, a CRES shank 820, a transverse spring 830, and at least one retaining ball 840. The head 810 can be fabricated from some alumina alloy, other ceramic, anodized aluminum, or some metallic or ceramic material coated with some fine coating ceramic material.

The CRES shank 820 is substantially cylindrical and is constructed with a cross drilled hole 850 perpendicular to axis 860 of the hybrid spring plunger ball-lock device 800. The cross drilled hole 850 can have any diameter as long as the diameter near the outer surface of the CRES shank 820 is smaller than the diameter of the retaining ball 840. The retaining ball 840 and transverse spring 830 are retained in the CRES shank 820 by the smaller diameter of the cross-drilled hole 850.

The cross-drilled hole 850 has a substantially uniform diameter during the manufacture of the CRES shank 820. After the manufacture of the CRES shank 820, the cross-drilled hole 850 is processed to have said smaller diameter near the outer surface of the CRES shank 820. The process of modifying the cross drilled hole 850 after assembly of the transverse spring 830 and retaining ball 840 to the CRES shank 820 is accomplished with common metal cold working techniques.

Mating of the CRES shank 820 with head 810 is accomplished with common brazing techniques. This process is common to persons having ordinary skill in the art. Kovar is the preferred brazing material to form a braze joint between the CRES shank 820 and head 810. However, kovar is not the only brazing alloy possible. Invar and other alloy brazing alloys containing iron, nickel and cobalt can be used.

Figure 5E:
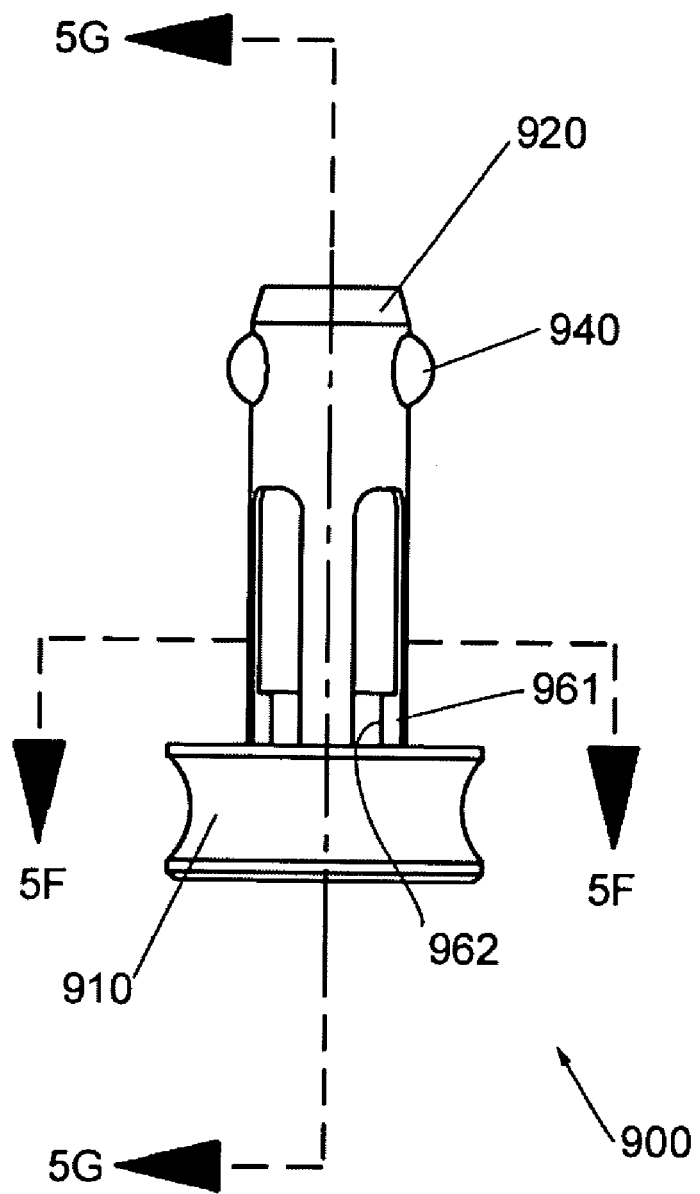
FIG. 5E represents an embodiment of a hybrid spring plunger ball-lock device wherein the spring and balls are retained in place with a sleeve attached to the head by thin clamping fingers of CRES material.
Figure 5F:
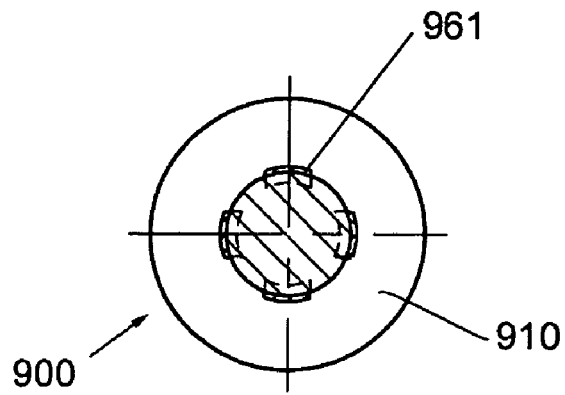
FIG. 5F represents a sectional view of the embodiment of FIG. 5E showing head and sleeve with associated clamping fingers.
Figure 5G:
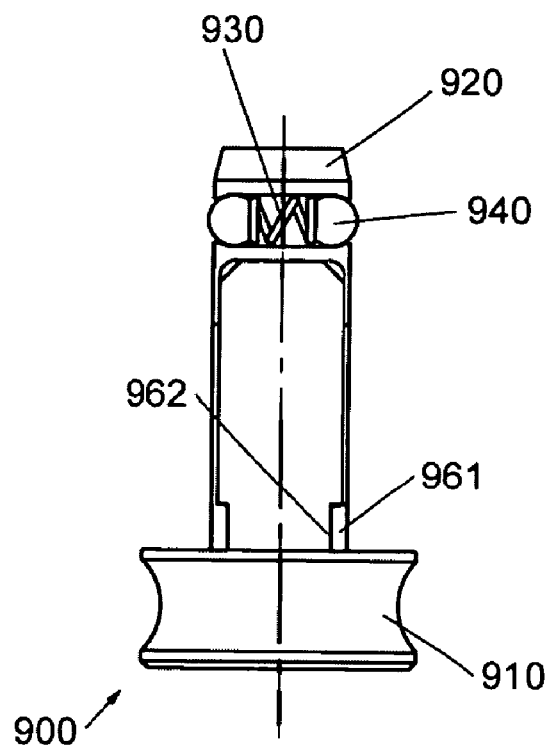
FIG. 5G represents a sectional view of the embodiment of FIG. 5E showing internal components.

A further embodiment of the present invention employs the use of a hybrid spring plunger ball-lock device 900 and is depicted in FIG. 5E, FIG. 5F and FIG G. The hybrid spring plunger ball-lock device 900 is comprised of a head 910, a CRES shank 920, a transverse spring 930, and at least one retaining ball 940. The head 910 can be fabricated from some alumina alloy, other ceramic, anodized aluminum, or some metallic or ceramic material coated with some fine coating ceramic material.

The CRES shank 920 is constructed such that two or more thin retaining fingers 961 are fashioned to mate to a groove 962 in head 910. The fingers 961 secure the CRES shank 920 to the head 910 as the hybrid spring plunger ball-lock device 900 is assembled together.

When assembling an exemplary system of the present invention using either hybrid spring plunger ball-lock type device 600, hybrid spring plunger ball-lock type device 700, hybrid spring plunger ball-lock type device 800 or hybrid spring plunger ball-lock type device 900 or a combination thereof, components including inject plate 525, baffle plate 535, lower electrode portion 540, and upper electrode portion 550 can be joined together using the hybrid spring plunger ball-lock device 600, hybrid spring plunger ball-lock device 700, hybrid spring plunger ball-lock device 800, or hybrid spring plunger ball-lock device 900. As understood by one of ordinary skill in the art, any subset of these components can be fastened together using a ball-lock device.

As is known to one of ordinary skill in the art, any of the hybrid ball-lock devices described herein can be used alone or in conjunction with other ball lock devices in the same plasma processing device. Furthermore, different types of hybrid ball-lock devices can be used in the same plasma processing device.

The invention claimed is:

1. A plasma processing device comprising: an inject plate including a first hole with a first diameter; an upper electrode including a second hole with a recessed area having a second diameter larger than the first diameter; and a hybrid ball-lock device configured to removably secure the inject plate to the upper electrode by expanding into the recessed area, wherein a boundary of the recessed area is formed by a lower electrode formed separately from the inject plate, and wherein the boundary is a portion of a seam formed between the upper electrode and the lower electrode.

2. The plasma processing device of claim 1, wherein the hybrid ball-lock device comprises an actuating hybrid ball-lock device.

3. The plasma processing device of claim 1, wherein the hybrid ball lock device comprises an actuating hybrid spring-plunger device.

4. The plasma processing device of claim 1 wherein the hybrid ball-lock device comprises a ceramic head.

5. The plasma processing device of claim 1 wherein the hybrid ball-lock device comprises a silicon head.

6. The plasma processing device of claim 1 wherein the hybrid ball-lock device comprises a quartz head.

7. The plasma processing device of claim 6 wherein the head is coated with a ceramic material.

8. The plasma processing device of claim 1 wherein the hybrid ball-lock devices comprises an anodized aluminum head.

9. The plasma processing device of claim 1 wherein the hybrid ball-lock device comprises a metallic head.

10. The plasma processing device of claim 1, wherein the hybrid ball-lock device comprises a CRES fastener housing.

11. The plasma processing device of claim 1 wherein the hybrid ball-lock device or threaded shaft is removably connected to a release button.

12. The plasma processing device of claim 1, wherein the hybrid ball-lock device comprises at least one retaining ball.

13. The plasma processing device claim 1, further comprising a process chamber in which the inject plate is removably secured by the hybrid ball-lock device, and the inject plate is configured to accept insertion to the ball-lock device from inside the process chamber.

14. The plasma processing device of claim 13, wherein the second hole is a blind hole.

15. The plasma processing device of claim 13, wherein the hybrid ball-lock device comprises a spring with an axis oriented perpendicular to an axis of the second hole and configured to push a ball into the recessed area.

16. The plasma processing device of claim 1, wherein a button of the hybrid ball-lock device comprises a getter material.

17. The plasma processing device of claim 1, wherein the seam is sealed by a compressible seal so as to prevent gas leakage between a process chamber of the plasma processing device and an area outside the process chamber.

18. The plasma processing device of claim 1, wherein the lower electrode is disposed directly between the upper electrode and the inject plate.

19. The plasma processing device of claim 18, wherein the lower electrode includes a third hole axially aligned with axes of the first and second holes.

20. The plasma processing device, of claim 19, wherein the third hole has a third diameter smaller than the second diameter.

* * * * *